(12) United States Patent
Kim et al.

(10) Patent No.: US 6,740,904 B2
(45) Date of Patent: May 25, 2004

(54) SILICON LIGHT-EMITTING DEVICE AND DISPLAY APPARATUS EMPLOYING THE SAME

(75) Inventors: Jun-young Kim, Gunpo (KR); Byoung-lyong Choi, Seoul (KR); Eun-kyung Lee, Suwon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 7 days.

(21) Appl. No.: 10/294,549

(22) Filed: Nov. 15, 2002

(65) Prior Publication Data

US 2003/0168665 A1 Sep. 11, 2003

(30) Foreign Application Priority Data

Mar. 7, 2002 (KR) ........................................ 2002-12157

(51) Int. Cl.[7] ............................................... H01L 27/15
(52) U.S. Cl. .............................. 257/86; 257/14; 257/49
(58) Field of Search ................................ 257/14, 49, 86

(56) References Cited

FOREIGN PATENT DOCUMENTS

| | | | |
|---|---|---|---|
| EP | 001251568 A2 | * | 10/2002 |
| EP | 001328024 A2 | * | 7/2003 |
| JP | 2003218385 | * | 7/2003 |

* cited by examiner

Primary Examiner—Long Pham
(74) Attorney, Agent, or Firm—Sughrue Mion, PLLC

(57) ABSTRACT

A silicon light-emitting device and a display device employing the silicon light-emitting device are provided. In the silicon light-emitting device, a doped region is ultra-shallowly doped with the opposite type dopant to the type of the substrate on one side of the substrate, so that the p-n junction between the doped region itself and the substrate creates luminance by annihilation combination of electron-hole pairs due to the quantum confinement effect. At least one semiconductor material portion at least partially forms a stack along with the doped region on the other side of the substrate. First, second, and third electrodes are formed for electric connection. The silicon light-emitting device includes a transistor of at least one step and accordingly performs current amplification and/or switching. Thus, luminance can be driven just with a small amount of current. In addition, when an array of silicon light-emitting devices is adopted in a display device, the turn-on and turn-off durations for used current can be controlled on a pixel-by-pixel basis. Therefore, the luminance duration can be easily controlled.

7 Claims, 6 Drawing Sheets

SILICON LIGHT-EMITTING DEVICE AND DISPLAY APPARATUS EMPLOYING THE SAME

BACKGROUND OF THE INVENTION

1. Field of the Invention

The present invention relates to a silicon light-emitting device having circuits required for driving radiation and a display device employing the silicon light-emitting device. The present application is based on Korean Patent Application No. 2002-12157, filed Mar. 7, 2002.

2. Description of the Related Art

Silicon semiconductor substrates can be highly integrated with logic circuits, arithmetic circuits, and drive devices with high reliability. Because silicon is inexpensive, highly integrated circuits using silicon can be obtained at a much lower cost than when using a compound semiconductor. Accordingly, most integrated circuits use silicon (Si) as their fundamental material.

Due to the indirect transition bandgap of silicon, it is difficult for light emission to occur in silicon. Accordingly, a light-emitting device, such as a light emitting diode (LED), is made of a compound semiconductor material that has a direct transition bandgap and contributes to light emission.

A light-emitting device emits light only when it is subjected to current higher than a critical current. Hence, in order to supply appropriate current to light-emitting devices, amplification circuits for amplifying low current into current suitable to oscillate the light-emitting devices, and/or switching circuits for controlling a light-emitting on-off operation, are typically required.

However, due to a hybrid junction, compound semiconductor light-emitting devices cannot be combined with silicon-based amplification circuits and/or silicon-based switching circuits through a series of semiconductor manufacturing processes.

Hence, compound semiconductor light-emitting devices must have separate amplification circuits and/or switching circuits externally installed.

Such external installing of a separate amplification circuit on a light-emitting device impedes high-speed switching due to the parasitic effect of the reactance or capacitance of external power lines.

Also, when compound semiconductor light-emitting devices are formed in an array and the array is to be used as a display device, a switching circuit must be externally installed so that light emission occurs at individual pixels. In this case, it is difficult to control the turn-on and turn-off periods of current on a pixel-by-pixel basis. As a result, controlling light-emitting duration is difficult.

SUMMARY OF THE INVENTION

To solve the above-described problems, it is an object of the present invention to provide a silicon light-emitting device that is formed on a substrate based on silicon and includes a transistor of at least one step to serve as an amplification circuit and/or switching circuit, and a display device adopting the silicon light-emitting device.

To achieve the above object, the present invention provides a silicon light-emitting device having an n- or p-type substrate, a doped region, a plurality of semiconductor material portions, and first, second, and third electrodes. The n- or p-type substrate is based on silicon. The doped region is ultra-shallowly doped, on one side of the substrate, with the opposite type dopant to the type of the substrate. The plurality of semiconductor material portions at least partially form a stack along with the doped region on the other side of the substrate. The first electrode is electrically connected to the doped region. The second electrode is electrically connected to a first semiconductor material portion, when a semiconductor material portion located at the outmost of the stack is referred to the first semiconductor material portion, and a semiconductor material portion adjacent to the inner side of the first semiconductor material portion is referred to as a second semiconductor material portion. The third electrode is electrically connected to the second semiconductor material portion. Here, a semiconductor material portion adjacent to the substrate is formed in the opposite type to the type of the substrate, and adjacent semiconductor material portions are formed in opposite types, so that a transistor having at least two steps is formed.

Preferably, either the first or second electrode serves as a cathode and the other as an anode, and the third electrode serves as a gate.

The silicon light-emitting device further includes an insulating film formed on some area of the second semiconductor material portion, and a high resistance material layer formed on the insulating film and the second semiconductor material portion, the high resistance material layer on which the third electrode is formed. The third electrode is electrically connected through the high resistance material layer to a narrow area of the second semiconductor material portion defined by the insulating film.

The plurality of semiconductor material portions are formed by injecting a dopant into the other side of the substrate deeper than the doped region.

To achieve the above object, the present invention also provides a silicon light-emitting device including an n- or p-type substrate based on silicon; a doped region ultra-shallowly doped with the opposite type dopant to the type of the substrate on one side of the substrate; a semiconductor material portion formed of the opposite type to the type of the substrate on the other side of the substrate; a first electrode electrically connected to the doped region; a second electrode electrically connected to the semiconductor material portion; and a third electrode electrically connected to the substrate. Accordingly, a transistor having a single step is included in the silicon light-emitting device.

To achieve the above object, the present invention also provides a display device having at least one silicon light-emitting device. In the silicon light-emitting device, an n- or p-type substrate is based on silicon. A doped region is ultra-shallowly doped with the opposite type dopant to the type of the substrate on one side of the substrate. A plurality of semiconductor material portions at least partially form a stack along with the doped region on the other side of the substrate. A first electrode is electrically connected to the doped region. A second electrode is electrically connected to a first semiconductor material portion, when a semiconductor material portion located at the outmost of the stack is referred to the first semiconductor material portion, and a semiconductor material portion adjacent to the inner side of the first semiconductor material portion is referred to as a second semiconductor material portion. A third electrode is electrically connected to the second semiconductor material portion. In this structure, a semiconductor material portion adjacent to the substrate is formed in the opposite type to the type of the substrate, adjacent semiconductor material portions are formed in opposite types. Accordingly, each of the silicon light-emitting devices includes a transistor having at least two steps.

To achieve the above object, the present invention also provides a display device having at least one silicon light-emitting device, the silicon light-emitting device including: an n- or p-type substrate based on silicon; a doped region ultra-shallowly doped with the opposite type dopant to the type of the substrate on one side of the substrate; a semiconductor material portion formed in the opposite type to the type of the substrate on the other side of the substrate; a first electrode electrically connected to the doped region; a second electrode electrically connected to the semiconductor material portion; and a third electrode electrically connected to the substrate. Accordingly, each of the silicon light-emitting devices includes a transistor of a single step.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
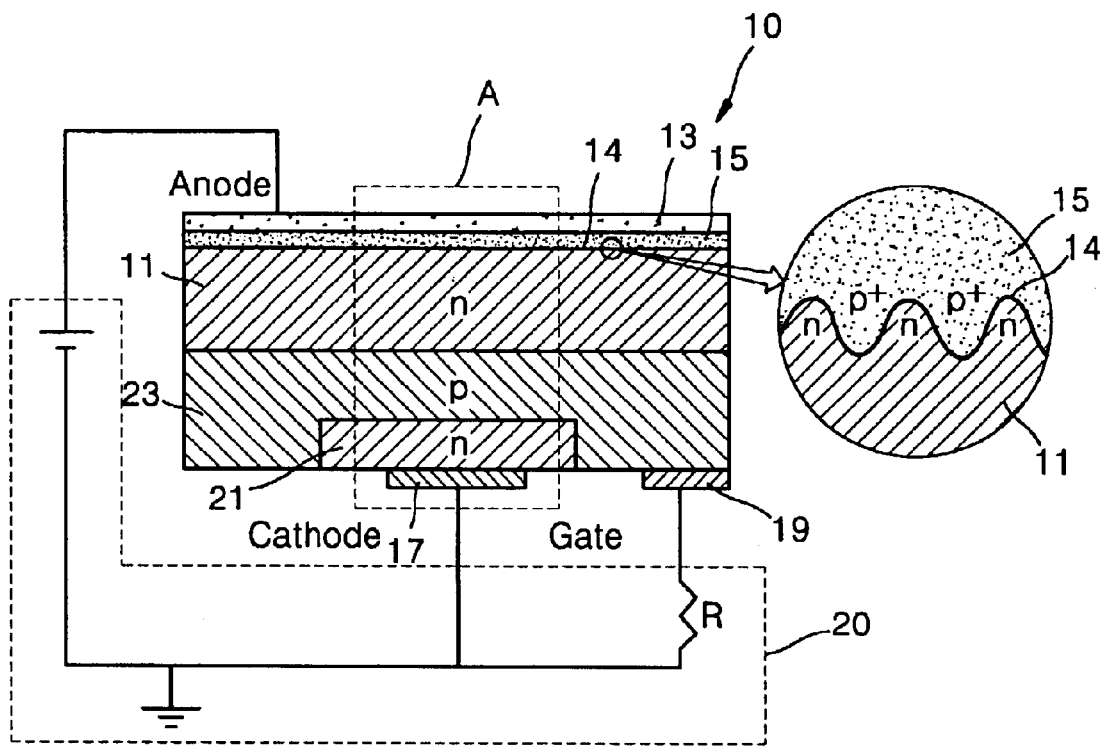
FIG. 1 shows a silicon light-emitting device according to a first embodiment of the present invention and an external driving circuit for the silicon light-emitting device.

FIG. 1 shows a silicon light-emitting device 10 according to a first embodiment of the present invention and an external driving circuit 20 for the silicon light-emitting device.

Referring to FIG. 1, the silicon light-emitting device 10 includes a substrate 11 made of n- or p-type silicon-based material, and a doped region 15 ultra-shallowly doped with the opposite type dopant to the substrate 11 on one side of the substrate 11. In the silicon light-emitting device 10, a plurality of semiconductor material portions 21 and 23 are at least partially stacked on the other side of the substrate 11 along with the doped region 15 as shown in portion A surrounded by dots. The silicon light-emitting device 10 also includes first through third electrodes 13, 17, and 19 for electrical connection. As described below, the silicon light-emitting device 10 according to the first embodiment of the present invention includes a transistor of at least two steps.

The substrate 11 is a silicon-based substrate formed of a semiconductor material containing silicon (Si), such as, Si, SiC, or diamond, and doped to be an n-type or p-type.

The doped region 15 is doped in the opposite type to the type of the substrate 11 by injecting a predetermined dopant, such as boron or phosphorous, into the substrate 11 via the opening of a control film (not shown) using non-equilibrium diffusion. For example, the doped region 15 is doped in a p+ type.

Here, the control film serves as a mask when the doped region 15 is formed, and controls the doped region 15 to be formed to a desired shallow depth. FIG. 1 shows the silicon light-emitting device 10 from which the control layer has been removed. The control film may remain on one side of the substrate 11.

During doping, at least one of a quantum well, a quantum dot, and a quantum wire is formed in a boundary between the doped region 15 and the substrate 11, that is, a p-n junction 14. Preferably, the doped region 15 is ultra-shallowly doped so that photoelectric conversion efficiency, that is, the annihilation combination of electron-hole pairs, is generated with high quantum efficiency by a quantum confinement effect.

Here, a quantum well is mainly formed at the p-n junction 14. Alternatively, either a quantum dot or a quantum wire can be formed at the p-n junction 14. Two or more of the quantum well, the quantum dot, and the quantum wire can also be formed at the p-n junction 14. Hereinafter, the case where a quantum well is formed at the p-n junction 14 will be described for simplicity. Accordingly, even though it is described hereinafter that a quantum well is formed at the p-n junction 14, it must be considered that at least one of the quantum well, the quantum dot, and the quantum wire is formed.

Figure 2:
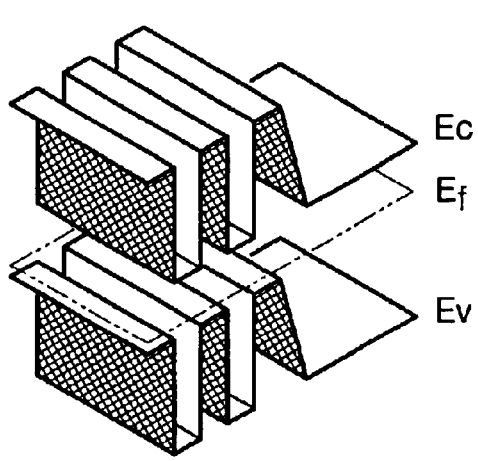
FIG. 2 shows the energy bands of longitudinal and lateral quantum wells (QW) formed in a p-n junction when a doped region is ultra-shallowly formed by non-equilibrium diffusion.
Figure 2:
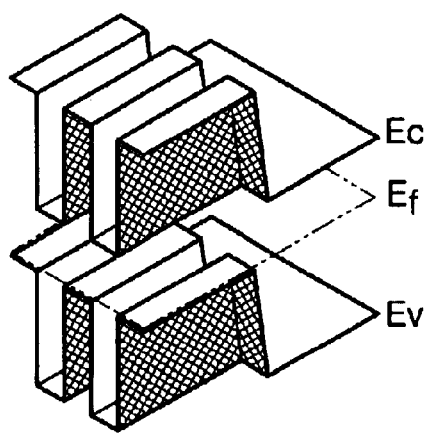

FIG. 2 shows the energy bands of longitudinal and lateral quantum wells (QW) formed at the p-n junction 14 when the doped region 15 is ultra-shallowly formed by non-equilibrium diffusion. In FIG. 2, reference character Ec denotes a conduction band energy level, reference character Ev denotes a valence band energy level, and reference character Ef denotes a Fermi energy level. These energy levels are well known in the field of semiconductor-related technology, so they will not be described in detail.

The p-n junction 14 has a quantum well structure in which different doped layers alternate. Here, a well and a barrier are approximately 2 nm and 3 nm, respectively.

Such ultra-shallow doping to form a quantum well at the p-n junction 14 can be achieved by optimally controlling the thickness of the control film and the conditions of a diffusion process.

During diffusion, the thickness of a diffusion profile can be controlled to, for example, 10–20 nm, by an appropriate diffusion temperature and the deformed potential of the surface of the substrate 11. In such an ultra-shallow diffusion profile, a quantum well system is created. Here, the potential of the surface of the substrate 11 is deformed by the thickness of the control film at its initial stage and a surface pretreatment, and the deformation becomes worse as diffusion progresses.

Preferably, the control film is a silicon oxide film SiO$_2$ having a proper thickness that enables the doped region 15 to be doped to an ultra-shallow depth. For example, the control film is formed to have a mask structure by forming a silicon oxide film on one side of the substrate 11 and etching the silicon oxide film using photolithography to obtain an opening for diffusion.

As well known in the field of diffusion technologies, if the silicon oxide film is thicker than the proper thickness (for example, several thousand Å) or a diffusion temperature is low, vacancy mainly affects diffusion and, hence, deep diffusion occurs. If the silicon oxide film is thinner than the proper thickness or the diffusion temperature is high, Si self-interstitial mainly affects diffusion and, accordingly, deep diffusion occurs. Accordingly, when the silicon oxide film is formed to the proper thickness in which Si self-interstitial and vacancy are created at similar percentages, the Si self-interstitial and vacancy are combined together so that diffusion of a dopant is counteracted. Thus, ultra-shallow doping is possible. The physical properties of the Si self-interstitial and vacancy are well known in the technical field relating to diffusion, so they will not be described in detail.

In the silicon light-emitting device 10 according to the first embodiment of the present invention as described above, a quantum well in which electron-hole pairs are annihilated by combination is formed at the p-n junction 4 between the doped region 15 and the substrate 11. Hence, as described above, the silicon light-emitting device 10 emits light.

That is, when the silicon light-emitting device 10 is subjected to driving current, carriers, that is, electrons and holes, are implanted into the quantum well in the p-n junction 14 and re-combined (annihilation-combined) through a sub-band energy level within the quantum well. At this time, electro-luminescence (EL) in a predetermined wavelength occurs according to the state in which carriers are combined. The amount of emitted light varies according to the magnitude of the applied driving current.

Here, the wavelength of luminance in the silicon light-emitting device 10 is determined according to micro-cavities due to micro-defects generated on the surface of the substrate 11 (actually on the surface of the doped region 14). Accordingly, the silicon light-emitting device 10 can have a desired wavelength band by adjusting the size of the micro-cavity in a manufacturing process.

Here, the intensity of the EL can be amplified when matching well with the resonance wavelength of the micro-cavities due to micro-defects generated on the surface of the substrate 11.

Accordingly, proper adjustment of the micro-cavity sizes through a manufacturing process enables light emission in a particular wavelength range. Or, diversification of the micro-cavity sizes can achieve white light emission.

The micro-cavities are created from deformed potential due to micro-defects formed on the surface of the doped region 14. Hence, a quantum well can be deformed by adjusting the deformed potential, and consequently the micro-cavities are determined. Accordingly, luminance of a desired particular wavelength or white light can be obtained by controlling the micro-cavities.

In the silicon light-emitting device 10 having the doped region 15 doped to an ultra-shallow depth, the quantum confinement effect is generated in the p-n junction 14 due to a local change in charge distribution potential. The sub-band energy level formed within the quantum well provides high quantum efficiency.

A silicon light device, in which a control film for use as a mask is formed on the silicon-based substrate 11, the doped region 15 is doped to an ultra-shallow depth using the control film, and light emission due to the quantum confinement effect occurs in the p-n junction 14 between the doped region 15 and the substrate 11, is disclosed in detail in Korean Patent Application No. 02-1431, entitled "Silicon optical device and light-emitting device adopting the same", filed by the applicant of the present invention.

This patent application describes in detail that a silicon optical device including the ultra-shallow doped region 15 can emit light of a particular wavelength or white light.

As to a technique of forming the ultra-shallow doped region 15 in the silicon light-emitting device 10 and a technique regarding luminescence of light of a particular wavelength, such as, a red, green, or blue wavelength, or white light, corresponding contents in the above Korean patent application are referred to. Hence, the above techniques will not be described and shown in detail.

If the substrate 11 is formed of a p-type material, the doped region 15 is doped with an n+-type material.

The plurality of semiconductor material portions includes a first semiconductor material portion 21 located at the outermost part of the stack structure indicated by A, and a second semiconductor material portion 23 adjacent to the inner side of the first semiconductor material portion 21.

In FIG. 1, the plurality of semiconductor material portions includes the first and second semiconductor material portions 21 and 23. Accordingly, the silicon light-emitting device 10 of FIG. 1 is an example of a structure having a 2-step transistor. Hereinafter, the first embodiment in which the first and second semiconductor material portions 21 and 23 are formed as the plurality of semiconductor material portions for the silicon light-emitting device 10 will be described with reference to FIG. 1. However, this embodiment does not limit the scope of the present invention. That is, the silicon light-emitting device 10 according to the present invention may have a transistor constructed in at least 2 steps.

The first and second semiconductor material portions 21 and 23 can be formed on the other side of the substrate 11, that is, on the side of the substrate 11 on which nothing is formed, by injecting a dopant deeper than the doped region 15. For example, the second semiconductor material portion 23 is formed by injecting the opposite type dopant to that of the substrate 11 into the other side of the substrate 11 using a general diffusion process so that the dopant is diffused deeper than the doped region 15. Thereafter, the first semiconductor material portion 21 is formed on part of the second semiconductor material portion 23 by injecting the opposite type dopant to that of the second semiconductor material portion 23 using the general diffusion process used to form the second semiconductor material portion 23. Either or both of the first and second semiconductor material portions 21 and 23 can be formed by injecting a dopant using an implantation method.

Here, the second semiconductor material portion 23 may be formed by depositing the opposite type material to the substrate 11, that is, a p-type semiconductor material, on the other side of the substrate 11. In this case, the first semiconductor material portion 21 may be formed by partially etching the second semiconductor material portion 23 and depositing the opposite type material, for example, an n-type semiconductor material, on the etched area of the second semiconductor material portion 23. Alternatively, the first semiconductor material portion 21 may be formed on some area of the second semiconductor material portion 23 by injecting a dopant of the opposite type to the second semiconductor material portion 23.

The first electrode 13 is formed so as to be electrically connected to the doped region 15. The second electrode 17 is formed so as to be electrically connected to the first semiconductor material portion 21. The third electrode 19 is formed so as to be electrically connected to the second semiconductor material portion 23. The first electrode 13 is formed of a transparent electrode material on the doped region 15 so as to transmit light emitted from the p-n junction 14 by the annihilation combination of electron-hole pairs due to a quantum confinement effect. Alternatively, the first electrode 13 can be formed of a metallic opaque material around a window area to emit radiated light. The second and third electrodes 17 and 19 can be formed of, for example, a metallic opaque material on the first and second semiconductor material portions 21 and 23, respectively.

In the silicon light-emitting device 10 having such a structure, if the substrate 11 is an n type, the doped region 15 is a p type, the second semiconductor material portion 23 is a p type, and the first semiconductor material portion 21 is an n type. In this case, the first electrode 13 is an anode, the second electrode 17 is a cathode, and the third electrode 19 is a gate.

Figure 3:
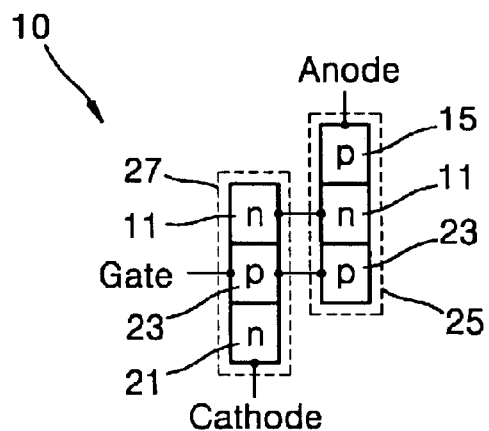
FIG. 3 shows the equivalent structure of the silicon light-emitting device of FIG. 1.
Figure 4:
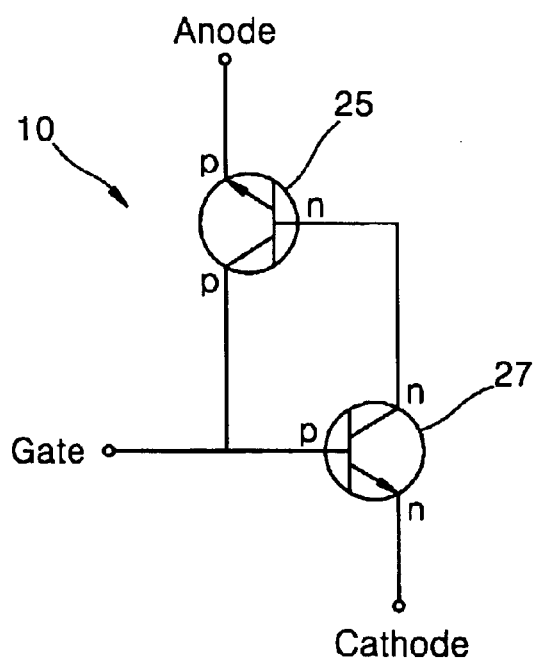
FIG. 4 shows the equivalent circuit of the silicon light-emitting device of FIG. 1.

When the substrate 11, the doped region 15, and the first and second semiconductor material portions 21 and 23 are formed of a conductive type material as shown in FIG. 1, the doped region 15, the substrate 11, and the second semiconductor material portion 23 form a pnp transistor structure 25, and the substrate 11, the second semiconductor material portion 23, and the first semiconductor material portion 21 form an npn transistor structure 27, as shown in FIGS. 3 and 4. FIGS. 3 and 4 show the equivalent structure and equivalent circuit, respectively, of the silicon light-emitting device 10 according to the first embodiment of the present invention shown in FIG. 1.

As can be seen from FIGS. 3 and 4, the silicon light-emitting device 10 according to the first embodiment of the present invention, which includes the doped region 15, the substrate 11, and the first and second semiconductor material portions 21 and 23, has a two-step transistor.

Figure 5:
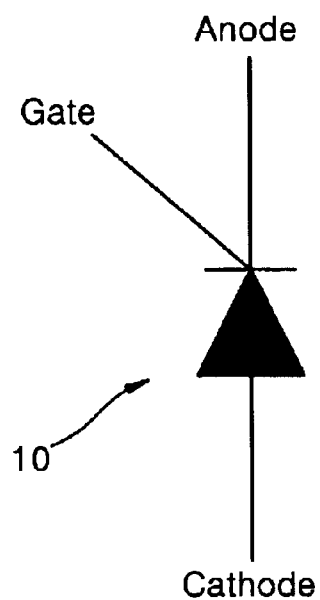
FIG. 5 shows the equivalent symbol of the silicon light-emitting device according to the first embodiment of the present invention, which has a transistor of two steps.

As will be explained below, the silicon light-emitting device 10 according to the first embodiment of the present invention, which has such a two-step transistor, can amplify fine current applied via the gate and simultaneously block reverse current. Also, the silicon light-emitting device 10 can turn on or off the luminance in the p-n junction 14 depending on the direction of the current applied via the gate. Hence, as shown in FIG. 5, the silicon light-emitting device 10 has a structure in which a switch is added to a diode that performs current amplification. FIG. 5 shows the equivalent symbol of the silicon light-emitting device 10 according to the first embodiment of the present invention, which has a two-step transistor.

Here, if the substrate 11 is a p-type substrate, and the conductive types of the doped region 15 and the first and second semiconductor material portions 21 and 23 are opposite to the conductive type of the substrate 11, the doped region 15, the substrate 11, and the second semiconductor material portion 23 form an npn transistor structure, while the substrate 11, the second semiconductor material portion 23, and the first semiconductor material portion 21 form a pnp transistor structure. In this case, the first, second, and third electrodes 13, 17, and 19 are a cathode, an anode, and a gate, respectively.

Figure 6:
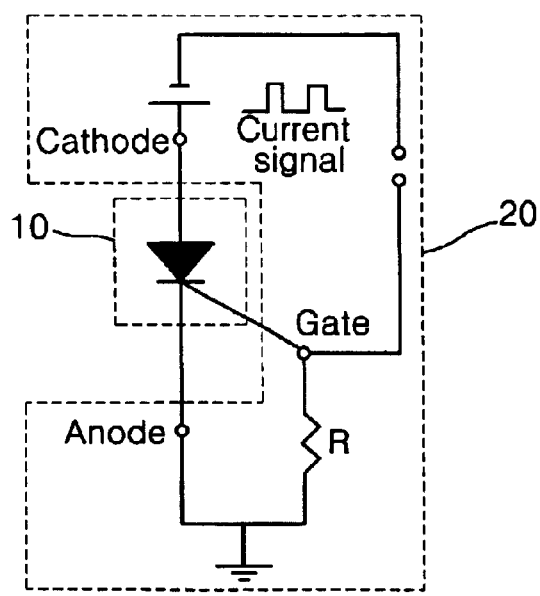
FIG. 6 shows the equivalent symbol of FIG. 5 and an external driving circuit for driving the silicon light-emitting device of FIG. 1.

FIG. 6 shows the equivalent symbol of FIG. 5 and an external driving circuit for driving the silicon light-emitting device 10 of FIG. 1. As can be seen from FIG. 6, the silicon light-emitting device 10 according to the first embodiment of the present invention has a structure in which a switch is added to a diode that can block reverse current.

That is, even when the anode and the cathode are subjected to reverse voltage, reverse current does not flow through the silicon light-emitting device 10. Also, even when the anode and the cathode are subjected to forward voltage, if forward current does not flow through the gate, no current flows either.

Hence, current can flow through the silicon light-emitting device 10 by applying forward voltage to the anode and the cathode and applying forward current to the gate. FIGS. 1 and 6 show examples in which the external driving circuit 20 that can apply forward voltage to the anode and the cathode and apply current to the gate is installed in the silicon light-emitting device 10 according to the first embodiment of the present invention.

If the gate is subjected to current, the both end voltage of the anode and cathode increase. If the gate is subjected to a particular current, the both end voltage of the anode and cathode, in which current suddenly flows, exists in the silicon light-emitting device 10 according to the first embodiment of the present invention. Such both end voltage is referred to as break over voltage.

If current is applied to the gate so that the both end voltage of the anode and cathode is equal to or greater than break over voltage, the anode and the cathode are conductive and can provide current necessary to promote luminance in the light-emitting device 10 according to the first embodiment of the present invention. Accordingly, by applying a very small quantity of current to the gate, the silicon light-emitting device 10 according to the first embodiment of the present invention, which includes a transistor of at least 2 steps, can also achieve luminance by annihilation combination of electron-hole pairs due to the quantum confinement effect provided by the p-n junction 14.

In the silicon light-emitting device 10 according to the first embodiment of the present invention, once the anode and the cathode begin conducting, the conduction state continues even when gate current (current applied via a gate) is blocked. Hence, in order to stop luminance in the silicon light-emitting device 10, gate current with the opposite sign must be applied to break the conduction state. Thus, square wave control pulse is applied to the gate current, and a power switching control pulse can also be applied as needed.

As described above, the silicon light-emitting device 10 according to the first embodiment of the present invention amplifies current using a 2-step transistor, such that an extremely small quantity of gate current contributes to luminance occurring in the p-n junction 14 due to the quantum confinement effect. In addition, the light-emitting device 10 functions as a switch, such that luminance duration can be controlled by changing the sign of the gate current. Here, the gate current serves as a trigger signal for a power on/off switch.

In this case, if current is applied to the gate, it flows through an npn transistor structure and drives the base current of a pnp transistor to flow. Accordingly, current flows in the p-n junction 14 where luminance is to occur.

Furthermore, in the silicon light-emitting device 10 according to the first embodiment of the present invention, once luminance occurs, it can be interrupted by only applying the current of the opposite sign to the gate.

Consequently, the luminance duration can be maintained for a desired period of time.

If a current signal applied to the gate is controlled by a square wave pulse, the luminance from the silicon light-emitting device 10 can be switched. Also, the luminance duration can be maintained as long as desired by controlling the period of the square wave pulse.

The silicon light-emitting device 10, according to the first embodiment of the present invention, described above with reference to FIG. 1 does not limit the scope of the present invention. In other words, the silicon light-emitting device 10 may include a transistor of at least 2 steps. As in a third embodiment to be described later, a silicon light-emitting device according to the present invention may also have a 1-step transistor.

As described above, the silicon light-emitting device 10 according to the first embodiment of the present invention includes an amplification transistor having at least 2 steps, such that luminance can occur by a small amount of gate current. The silicon light-emitting device 10 has a structure in which a switch is added to a diode, such that the luminance duration can be controlled and maintained as long as desired by controlling the polarity and pulse cycle of the gate current.

Figure 7:
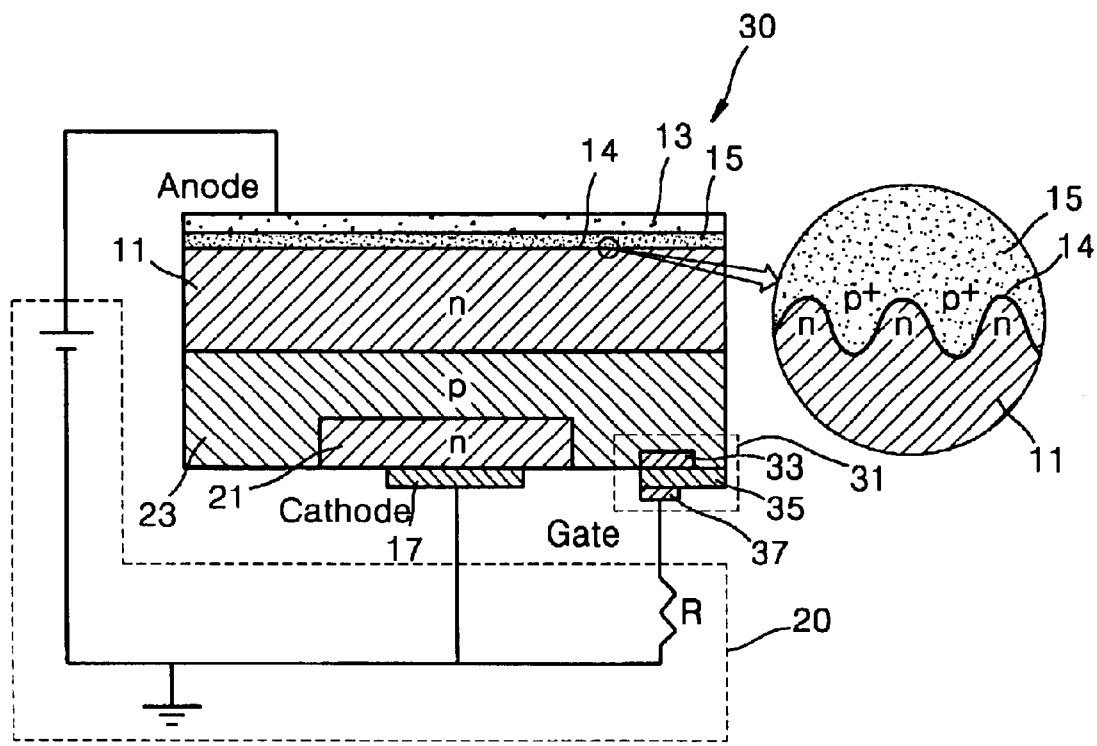
FIG. 7 is a schematic view of a silicon light-emitting device according to a second embodiment of the present invention.

FIG. 7 is a schematic view of a silicon light-emitting device 30 according to a second embodiment of the present invention. The silicon light-emitting device 30 is characterized in having a thick film resistor type gate structure 31. Here, the same or similar reference numerals as those in FIG. 1 refer to the same elements, so they will not be described again.

Referring to FIG. 7, the thick film resistor type gate structure 31 includes an insulating film 33, a resistance material layer 35, and a gate electrode 37. The insulating film 33 is formed on part of the second semiconductor material portion 23. For example, the insulating film 33 is formed on part of the area on which a gate electrode in the first embodiment, that is, the third electrode 19, is formed. The resistance material layer 35 is formed on the insulating film 33 and the second semiconductor material portion 23. The gate electrode 37 is formed on the resistance material layer 35 so as to be electrically connected via the resistance material layer 35 to a narrow area of the second semiconductor material portion 23 defined by the insulating film 33.

When the length, width, thickness, and resistivity of the resistance material layer 35 are indicated by l, w, t, and $\rho_s$, respectively, the resistance $R_L$ of the resistance material layer 35 is $(l\,\rho_s)/(wt)$. Accordingly, proper selection of the length, width, thickness, and the material of the resistance material layer 35 enables the resistance material layer 35 to have desired resistance. Here, the resistivity varies depending on the material.

Generally, an external resistor is introduced into a circuit for driving a light-emitting device in order to prevent the light-emitting device from malfunctioning due to excess current. A light-emitting device including the thick film resistor type gate structure 31 in which resistance is buried does not need to introduce the external resistor for preventing malfunction.

Figure 8:
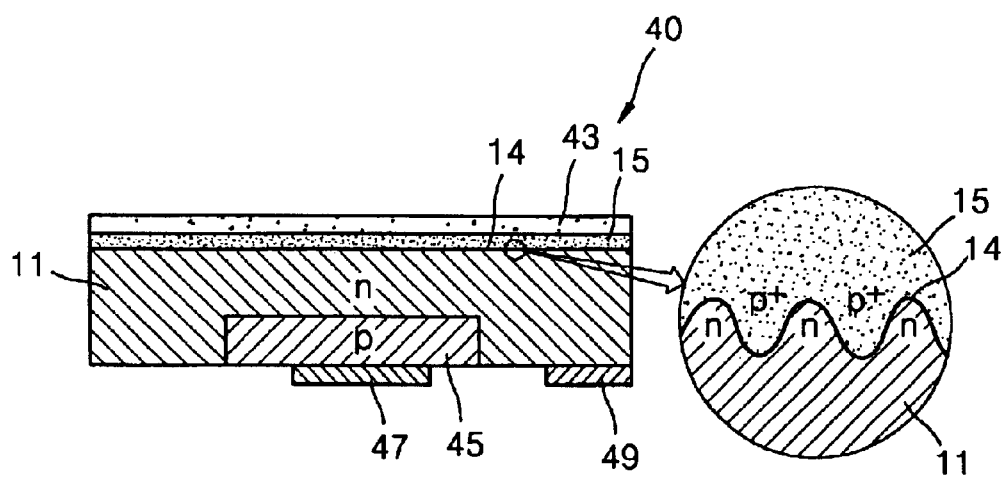
FIG. 8 is a schematic view of a silicon light-emitting device according to a third embodiment of the present invention.

FIG. 8 is a schematic view of a silicon light-emitting device 40 according to a third embodiment of the present invention. Referring to FIG. 8, the silicon light-emitting device 40 includes a substrate 11, a doped region 15, a semiconductor material portion 45, and first, second, and third electrodes 43, 47, and 49.

The substrate 11 is formed of n- or p-type material based on silicon. The doped region 15 is ultra-shallowly doped with the opposite type material to the conduction type of the substrate 11 on one side of the substrate 11, so that luminance can occur in the p-n junction 14 by annihilation combination of electron-hole pairs due to the quantum confinement effect. The semiconductor material portion 45 is formed of the opposite type material to the conduction type of the substrate 11 on the other side of the substrate 11. The first, second, and third electrodes 43, 47, and 49 are electrically connected to the doped region 15, the semiconductor material portion 45, and the substrate 11, respectively.

Figure 9:
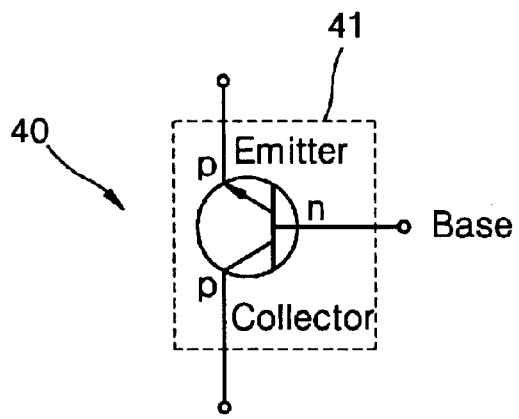
FIG. 9 shows the equivalent circuit of the silicon light-emitting device of FIG. 8.

As shown in FIG. 9, the silicon light-emitting device 40 according to the third embodiment of the present invention has a single-step transistor. Since the substrate 11 and the doped region 15 in the silicon light-emitting device 40 are substantially the same as those in the silicon light-emitting device 10 according to the first embodiment of the present invention in respect of their functions and formations, they are indicated by the same reference numerals as in the first embodiment and will not be described again.

The semiconductor material portion 45 can be formed by injecting a dopant into some area of the other side of the substrate deeper than the doped region 15. For example, the semiconductor material portion 45 is formed by injecting a dopant of the opposite type to the dopant type of the substrate 11 into the other side of the substrate 11 using a general diffusion process so that diffusion occurs deeper than the doped region 15. The semiconductor material portion 45 can also be formed using an implantation method to implant a dopant.

The semiconductor material portion 45 can also be formed by partially etching the other side of the substrate 11 and depositing the opposite type (e.g., p-type) semiconductor material to the type of the substrate 11 on the etched area of the substrate 11.

The first electrode 43 is formed as a transparent electrode on the doped region 15 so as to transmit light emitted from the p-n junction 14 by annihilation combination of electron-hole pairs due to the quantum confinement effect. Alternatively, the first electrode 43 can be formed of an opaque metallic material around a window area to emit radiated light. The second and third electrodes 47 and 49 can be formed of, for example, a metallic opaque material on the semiconductor material portions 45 and the substrate 11, respectively.

In the silicon light-emitting device 40 having such a structure, if the substrate 11 is an n type, both the doped region 15 and the semiconductor material portion 45 are doped with a p-type material. Accordingly, the doped region 15, the substrate 11, and the semiconductor material layer 45 form a pnp transistor 41 as shown in FIG. 9.

In the pnp transistor 41, preferably, the doped region 15 serves as a collector, the semiconductor material portion 45 serves as an emitter, and the substrate 11 serves as a base. Hence, the pnp transistor 41 can serve as a base ground circuit or an emitter ground circuit. In this case, it is also preferable that an intermediate layer "n" used as a base, that is, the substrate 11, is thin.

As described above, if the doped region 15, the semiconductor material portion 45, and the substrate 11 are used as a collector, an emitter, and a base, respectively, the first, second, and third electrodes 43, 47, and 49 electrically connected to them serve as a collector, an emitter, and a base electrode, respectively.

If the substrate 11 is an p-type substrate, and both the doped region 15 and the semiconductor material portion 45 are doped with the opposite conductive type material to the p-type substrate 11, the doped region 15, the substrate 11, and the semiconductor material layer 45 form an npn transistor. In this case, the doped region 15 serves as a collector, the semiconductor material portion 45 serves as an emitter, and the substrate 11 serves as a base.

The single-step transistor 41 in the silicon light-emitting device 40 according to the third embodiment of the present invention serves as a pulse switching circuit when forward voltage is applied between the base and the emitter and between the collector and the base.

In this case, preferably, a current signal for generating luminance in the p-n junction 14 between the doped region 15 and the substrate 11 is applied to the base. The single-step transistor 41 serves as a pulse switching circuit even when reverse voltage is applied between the emitter and the base and between the collector and the base.

As described above, the silicon light-emitting device 40 including such a single-step transistor can serve as a switching circuit for switching a light emitting device, in addition to serving as the light emitting device. Accordingly, in the silicon light-emitting device 40 according to the third embodiment of the present invention, forward voltage or reverse voltage is applied between the emitter and the base and between the collector and the base, such that the p-n junction 14 emits light due to the quantum confinement effect and, simultaneously, luminance can be turned on or off.

In addition, the single-step transistor 41 performs amplification when forward voltage is applied between the emitter and the base and reverse voltage is applied between the collector and the base. That is, single-step amplification is performed.

Hence, in the silicon light-emitting device 40, when forward voltage is applied between the emitter and the base and reverse voltage is applied between the collector and the base, luminance in the p-n junction 14 can occur even by the application of a small amount of current.

Even when the doped region 15, the substrate 11, and the semiconductor material portion 45 form a pnp transistor, the silicon light-emitting device 40 can also perform single-step amplification and pulse switching.

As described above, a transistor of at least one step, built in the silicon light-emitting device 40 according to the present invention, serves as a built-in active device capable of performing at least one function among amplification, switching, and state (e.g., current flowing or stopping) maintenance, thereby driving a light emitting device.

In the silicon light-emitting device 40, due to the built-in transistor of at least one step, internal current can be amplified, and accordingly luminance can occur with just a small amount of current. Also, the parasitic effect of the reactance or capacitance of an external power line, that is, a problem generated in a conventional light emitting device, which externally installs an amplification circuit, can be eliminated, so that fast switching is possible.

A silicon light-emitting device according to the present invention as described above can be applied to a display device. Here, the display device includes at least one silicon light-emitting device according to the present invention.

Figure 10:
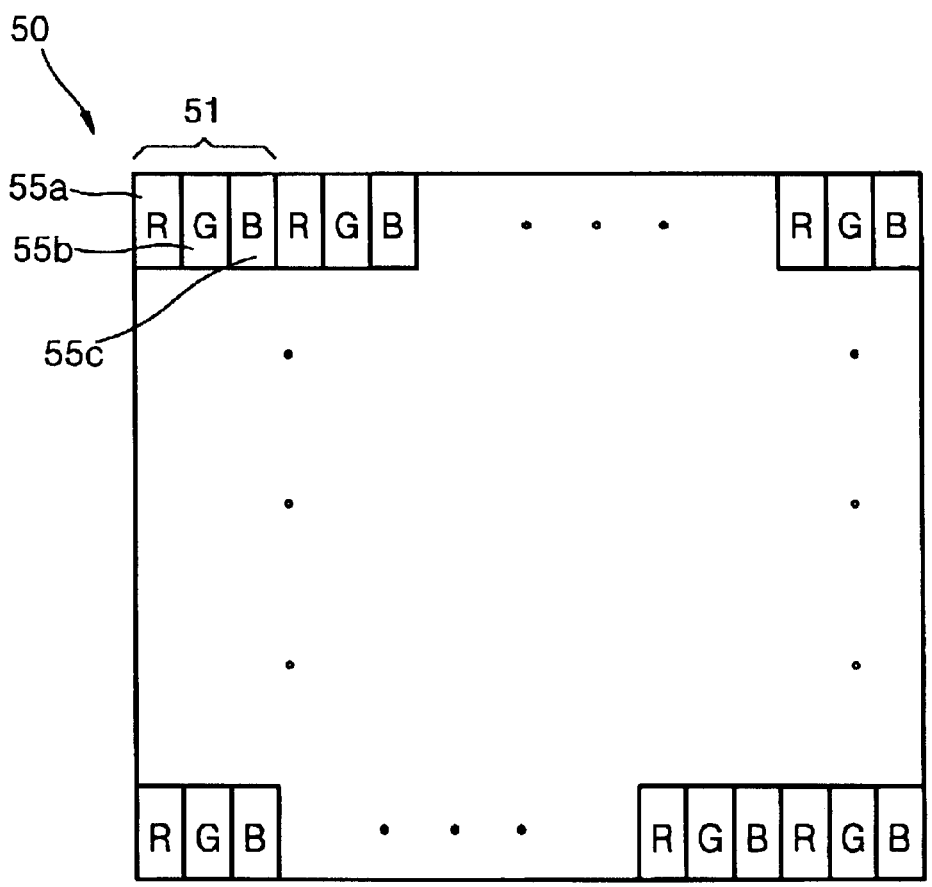
FIG. 10 is a schematic view of a first embodiment of a display device adopting a silicon light-emitting device according to the present invention.
Figure 11:
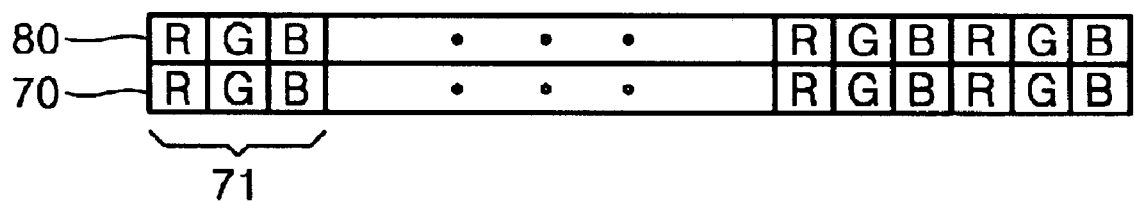
FIG. 11 is a schematic view of a second embodiment of a display device adopting a silicon light-emitting device according to the present invention.

For example, the display device adopting a silicon light-emitting device according to the present invention can be formed by arranging a plurality of silicon light-emitting devices according to the present invention in a two-dimensional array as shown in FIGS. 10 and 11.

Since the silicon light-emitting device according to the present invention can be extremely minimized by using a semiconductor material through a semiconductor manufacturing process, it can be obviously applied to a display device, particularly, to a flat panel solid-state display device. Also, due to a transistor of at least one step, the silicon light-emitting device according to the present invention can perform current amplification and/or switching. Accordingly, luminance can be achieved with only a small amount of current. When a plurality of silicon light-emitting devices according to the present invention are aligned in an array and the array is applied to a display device, the turn-on and turn-off durations for used current can be controlled on a pixel-by-pixel basis. As a result, the luminance duration can be easily controlled.

FIG. 10 shows a display device that can produce all of R, G, and B colors without color filters. In the display device of FIG. 10, a two-dimensional configuration 50 is formed with a plurality of silicon light-emitting devices according to the present invention in such a way that three silicon light-emitting devices 55a, 55b, and 55c for particular color lights, for example, red light (R), green light (G), and blue light (B), are arranged in each pixel 51. The silicon light-emitting devices 55a, 55b, and 55c for particular color lights have the structure of one of the silicon light-emitting devices 10, 30, and 40 according to the first, second, and third embodiments of the present invention. However, for example, the length of micro-cavities can be different from that in the first, second, and third embodiments in order to obtain different luminance wavelengths.

It is possible that a color filter is added to the display device of FIG. 10 in order to produce clear colors.

FIG. 11 shows another display device capable of achieving full color. In the display device of FIG. 11, a two-dimensional arrangement 70 is formed with a plurality of silicon light-emitting devices according to the present invention for emitting white light, and a wavelength selection color filter 80 is installed in front of the two-dimensional arrangement 70. Preferably, three silicon light-emitting devices according to the present invention for emitting white light are arranged in each pixel 71 such as to correspond to the R, G, and B elements of the color filter 80. Here, the arrangement of R, G, and B elements in the color filter 80 is the same as or similar to the two-dimensional arrangement 50 of FIG. 10.

The two-dimensional arrangements 50 and 70 and/or an arrangement of R, G, and B elements in the color filter 80 can vary.

To sum up, a silicon light-emitting device according to the present invention includes a transistor of at least one step and accordingly performs current amplification and/or switching. Thus, luminance can be driven just with a small amount of current.

In addition, when a plurality of silicon light-emitting devices according to the present invention form an array, and the array is adopted in a display device, the turn-on and turn-off durations for used current can be controlled on a pixel-by-pixel basis. Therefore, the luminance duration can be easily controlled.

What is claimed is:

1. A silicon light-emitting device comprising:
   an n- or p-type substrate based on silicon;
   a doped region ultra-shallowly doped with the opposite type dopant to the type of the substrate disposed on a first side of the substrate;
   a plurality of semiconductor material portions at least partially forming a stack along with the doped region disposed on a second side of the substrate opposite to the first side;

a first electrode electrically connected to the doped region;

a second electrode electrically connected to a first semiconductor material portion, where a semiconductor material portion located at an outermost portion of the stack is the first semiconductor material portion, and a semiconductor material portion adjacent to the inner side of the first semiconductor material portion is a second semiconductor material portion; and a third electrode electrically connected to the second semiconductor material portion, wherein a semiconductor material portion adjacent to the substrate is formed in the opposite type to the type of the substrate, and adjacent semiconductor material portions are formed in opposite types, so that a transistor having at least two steps is formed.

2. The silicon light-emitting device of claim 1, wherein either the first or second electrode serves as a cathode and the other as an anode and the third electrode serves as a gate.

3. The silicon light-emitting device of claim 2, further comprising:

an insulating film formed on an area of the second semiconductor material portion; and a high resistance material layer formed on the insulating film and the second semiconductor material portion, the high resistance material layer on which the third electrode is formed, wherein the third electrode is electrically connected through the high resistance material layer to a narrow area of the second semiconductor material portion defined by the insulating film.

4. The silicon light-emitting device of claim 1, wherein the plurality of semiconductor material portions are formed by injecting a dopant into the second side of the substrate deeper than the doped region.

5. A silicon light-emitting device comprising:

an n- or p-type substrate based on silicon;

a doped region ultra-shallowly doped with the opposite type dopant to the type of the substrate disposed on a first side of the substrate;

a semiconductor material portion formed in the opposite type to the type of the substrate on a second side of the substrate opposite to the first side of the substrate;

a first electrode electrically connected to the doped region;

a second electrode electrically connected to the semiconductor material portion; and a third electrode electrically connected to the substrate, wherein a transistor having a single step is included.

6. A display device having at least one silicon light-emitting device, the silicon light-emitting device comprising:

an n- or p-type substrate based on silicon;

a doped region ultra-shallowly doped with the opposite type dopant to the type of the substrate disposed on a first side of the substrate;

a plurality of semiconductor material portions at least partially forming a stack along with the doped region disposed on a second side of the substrate opposite to the first side of the substrate;

a first electrode electrically connected to the doped region;

a second electrode electrically connected to a first semiconductor material portion, wherein the first semiconductor material portion is a semiconductor material portion located at an outermost part of the stack, and adjacent to the inner side of the first semiconductor material portion is disposed a second semiconductor material portion; and a third electrode electrically connected to the second semiconductor material portion, wherein a semiconductor material portion adjacent to the substrate is formed in the opposite type to the type of the substrate, adjacent semiconductor material portions are formed in opposite types, such that each of the silicon light-emitting devices includes a transistor having at least two steps.

7. A display device having at least one silicon light-emitting device, the silicon light-emitting device comprising:

an n- or p-type substrate based on silicon;

a doped region ultra-shallowly doped with the opposite type dopant to the type of the substrate disposed on a first side of the substrate;

a semiconductor material portion formed in the opposite type to the type of the substrate disposed on a second side of the substrate opposite to the first side;

a first electrode electrically connected to the doped region;

a second electrode electrically connected to the semiconductor material portion; and a third electrode electrically connected to the substrate, wherein each of the silicon light-emitting devices includes a transistor of a single step.

* * * * *